United States Patent
Bedeschi et al.

(10) Patent No.: US 7,092,277 B2
(45) Date of Patent: Aug. 15, 2006

(54) PHASE-CHANGE MEMORY DEVICE WITH BIASING OF DESELECTED BIT LINES

(75) Inventors: Ferdinando Bedeschi, Monza (IT); Claudio Resta, Villa Di Tirano (IT)

(73) Assignee: STMicroelectronics, S.r.l., (IT)

( * ) Notice: Subject to any disclaimer, the term of this patent is extended or adjusted under 35 U.S.C. 154(b) by 0 days.

(21) Appl. No.: 10/926,784

(22) Filed: Aug. 25, 2004

(65) Prior Publication Data

US 2005/0047193 A1 Mar. 3, 2005

(30) Foreign Application Priority Data

Aug. 27, 2003 (EP) .................................. 03077667

(51) Int. Cl.
*G11C 11/00* (2006.01)
(52) U.S. Cl. .................. 365/148; 365/163; 365/189.09
(58) Field of Classification Search ................ 365/148, 365/163
See application file for complete search history.

(56) References Cited

U.S. PATENT DOCUMENTS

| | | | | | |
|---|---|---|---|---|---|
| 5,132,933 | A | * | 7/1992 | Schreck et al. | 365/185.2 |
| 5,353,252 | A | * | 10/1994 | Hashimoto | 365/189.09 |
| 5,517,448 | A | * | 5/1996 | Liu | 365/185.11 |
| 5,768,188 | A | * | 6/1998 | Park et al. | 365/185.03 |
| 5,852,578 | A | * | 12/1998 | Hoang | 365/185.28 |
| 5,886,937 | A | * | 3/1999 | Jang | 365/203 |
| 6,064,620 | A | * | 5/2000 | Mobley | 365/230.03 |
| 6,195,297 | B1 | | 2/2001 | Sano | 365/189.11 |
| 6,301,158 | B1 | * | 10/2001 | Iwahashi | 365/185.23 |
| 6,404,666 | B1 | | 6/2002 | Uchida | 365/104 |
| 6,522,594 | B1 | | 2/2003 | Scheuerlein | 365/206 |
| 2001/0052615 | A1 | * | 12/2001 | Fujiwara | 257/315 |
| 2003/0002338 | A1 | | 1/2003 | Xu et al. | 365/185.11 |
| 2003/0123281 | A1 | * | 7/2003 | Iwata et al. | 365/158 |
| 2004/0109361 | A1 | * | 6/2004 | Eby et al. | 365/189.09 |

FOREIGN PATENT DOCUMENTS

| | | |
|---|---|---|
| EP | 1326254 A1 | 7/2003 |
| JP | 02003188 | 1/1990 |
| WO | WO 03/158632 A1 | 7/2003 |

\* cited by examiner

OTHER PUBLICATIONS

European Search Report, EP 03077667, Mar. 30, 2004.

*Primary Examiner*—Tan T. Nguyen
(74) *Attorney, Agent, or Firm*—Lisa K. Jorgenson; Graybeal Jackson Haley; Paul F. Rusyn (57) ABSTRACT

A memory device is proposed. The memory device includes a matrix of memory cells arranged in a plurality of rows and a plurality of columns, each memory cell including a functional element with a programmable resistivity and a uni-directional conduction access element connected in series, a plurality of word lines and a plurality of bit lines, the memory cells of each row being connected to a corresponding word line and the memory cells of each column being connected to a corresponding bit line, means for driving the bit lines to a desired voltage, means for selecting at least one bit line in an operative condition of the memory device, each selected bit line being connected to the means for driving and each deselected bit line being disconnected from the means for driving, and means for selecting a word line in the operative condition, each access element associated with the selected word line and the at least one selected bit line being forward biased and the other access elements being reverse biased; the memory device further includes means for biasing the deselected bit lines in the operative condition to prevent a leakage current of the reverse biased access elements from forward biasing the access elements associated with the selected word line and the deselected bit lines.

28 Claims, 5 Drawing Sheets

PHASE-CHANGE MEMORY DEVICE WITH BIASING OF DESELECTED BIT LINES

PRIORITY CLAIM

This application claims priority from European patent application No. 03077667.8, filed Aug. 27, 2003, which is incorporated herein by reference.

TECHNICAL FIELD

The present invention relates to the data storage field, and more specifically to a memory device.

BACKGROUND

Different types of memory devices have been proposed in the last years. For example, a phase-change $E^2PROM$ is a non-volatile memory exploiting the properties of a material that can be reversibly switched between an amorphous phase and a crystalline phase. The phase-change material exhibits different electrical characteristics depending on its phase, each one representing a corresponding logic value. An example of a phase-change $E^2PROM$ is described in U.S. Pat. No. 5,166,758.

Typically, the memory device includes a matrix of memory cells, each one consisting of a functional element connected in series to an access element (such as the base-emitter junction of a bipolar transistor). The memory cells are arranged between corresponding word lines and bit lines.

In a stand-by condition, the word lines are kept at high voltage, so that all the access elements are reverse biased. However, a leakage current flows through each access element; for this reason, the bit lines are generally connected to a terminal providing a reference voltage, in order to avoid charging a stray capacitor associated with each bit line to a dangerous voltage.

During a writing or reading operation, all the bit lines are disconnected from the reference terminal. The voltage on a selected word line is then lowered, and one or more selected bit lines are driven to a voltage corresponding to the operation to be performed (while the other bit lines are left floating). In this condition, the access elements associated with the selected word line and the selected bit lines are forward biased.

A drawback of the solution described above is that the leakage currents in each deselected bit line charge the corresponding stray capacitor. The voltage reached on the deselected bit line can turn on the access element associated with the selected word line.

In this condition, the current flowing through the corresponding functional element raises the voltage on the selected word line; this voltage increase introduces a disturb in the operation of the memory device.

An additional drawback arises when the current flowing through the functional element reaches a value sufficient to switch the phase of the material. The phase switch can cause an undesired change of the value stored in the memory cell. In any case, even when the phase switch is only transient, a wrong value can be read if the memory cell is selected before a corresponding recovery time.

The problem is exacerbated when the temperature increases, since the leakage current typically depends on the temperature according to an exponential law. In addition, the total leakage current injected into each functional element in the selected word line is directly proportional to the number of access elements in the corresponding deselected bit line.

SUMMARY

It is an aspect of the present invention to prevent the leakage currents in the deselected bit lines from charging the corresponding stray capacitors over a dangerous voltage.

It is another aspect of the present invention to avoid turning on the access elements (in the deselected bit lines) that are associated with the selected word line.

It is still another aspect of the present invention to prevent any wrong reading of the memory cells or any undesired change in their state.

The accomplishment of these and other aspects may be achieved by a memory device.

Briefly, an aspect of the present invention provides a memory device including a matrix of memory cells arranged in a plurality of rows and a plurality of columns, each memory cell including a functional element with a programmable resistivity and a unidirectional conduction access element connected in series, a plurality of word lines and a plurality of bit lines, the memory cells of each row being connected to a corresponding word line and the memory cells of each column being connected to a corresponding bit line, means for driving the bit lines to a desired voltage, means for selecting at least one bit line in an operative condition of the memory device, each selected bit line being connected to the means for driving and each deselected bit line being disconnected from the means for driving, and means for selecting a word line in the operative condition, each access element associated with the selected word line and the at least one selected bit line being forward biased and the other access elements being reverse biased; the memory device further includes means for biasing the deselected bit lines in the operative condition to prevent a leakage current of the reverse biased access elements from forward biasing the access elements associated with the selected word line and the deselected bit lines.

Moreover, another aspect of the present invention provides a corresponding method of operating a memory device.

BRIEF DESCRIPTION OF THE DRAWINGS

Further features and the advantages of various aspects of the present invention will be made clear by the following description of a preferred embodiment thereof, given purely by way of a non-restrictive indication, with reference to the attached figures, in which.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1A:
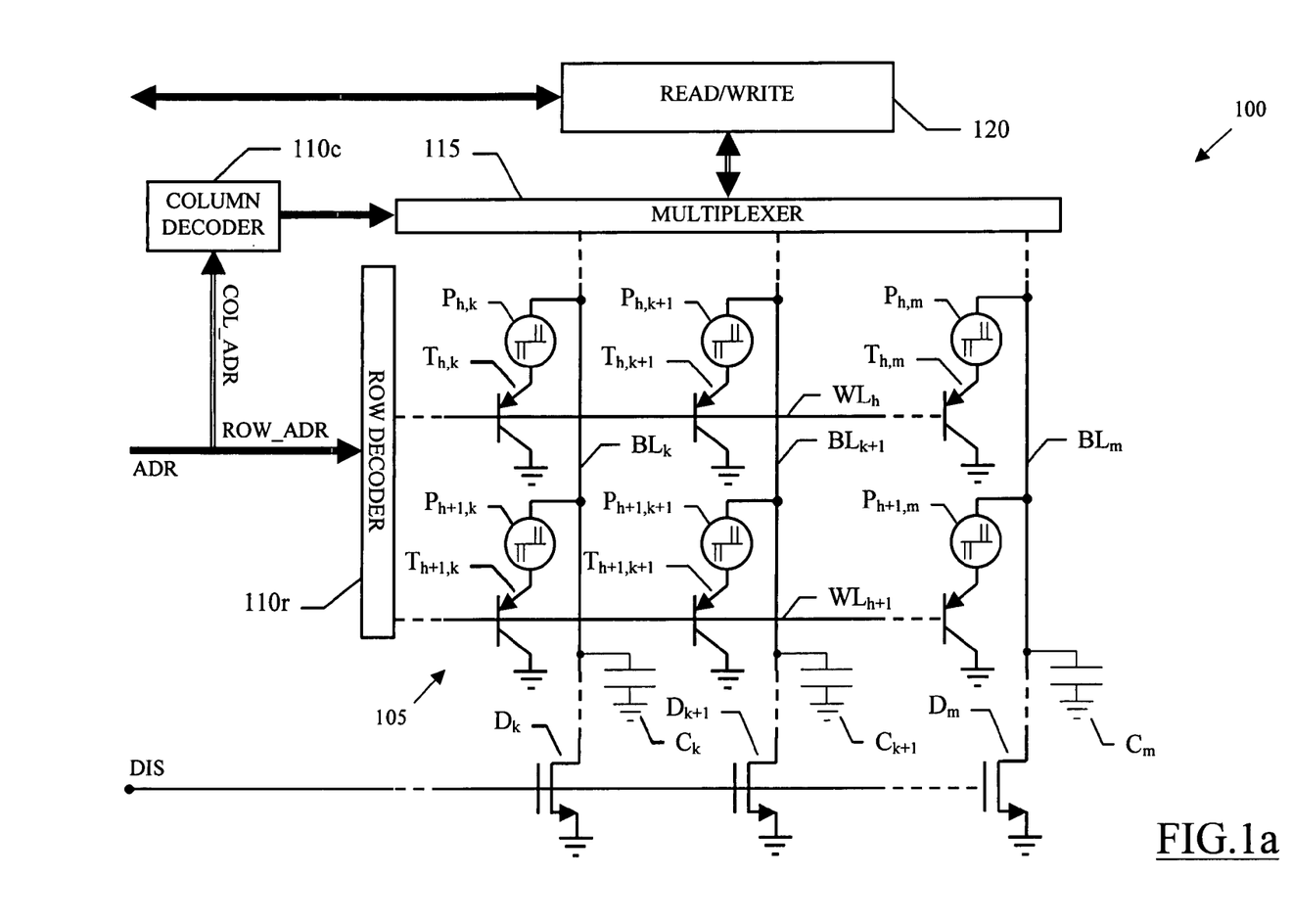
FIG. 1a shows a schematic block diagram of a memory device known in the art.

With reference in particular to FIG. 1, a memory device 100, consisting of an $E^2$PROM of the phase-change type, is shown. The memory device 100 includes a matrix 105 of memory cells (for example, arranged in n=2024 rows and m=4048 columns). Each memory cell is formed by a functional element $P_{h,k}$ (with h=1 ... n and k=1 ... m) having a programmable resistivity; the programmable element $P_{h,k}$ is connected in series to an access transistor $T_{h,k}$ (consisting of a BJT of the PNP type).

Each programmable element $P_{h,k}$ is made of a phase-change material; typically, the phase-change material consists of a calcogenide (such as an alloy $Ge_2Sb_2Te_5$). The phase-change material can be reversibly switched between a generally amorphous, disordered phase and a generally crystalline, high ordered phase. The two phases of the material exhibit different electrical characteristics; particularly, the material in the amorphous phase has a high resistivity (defining a reset state associated with a first logic value, for example, 0), whereas the material in the crystalline phase has a low resistivity (defining a set state associated with a second logic value, for example, 1).

Without descending to particulars well known in the art, the phase of the material is stable below a predefined temperature (such as 150° C.). The phase can be changed by heating the material over that temperature. For this purpose, a voltage higher than a corresponding phase-change value Vpc (for example, 0.6V) is applied to the programmable element $P_{h,k}$; the voltage causes a current to flow through a resistive element (or heater) in contact with the phase-change material, which element heats by the Joule effect and then raises the temperature of the change-phase material accordingly. If the programmable element $P_{h,k}$ is brought over a nucleation temperature (such as 200° C.) and then cooled slowly, the change-phase material becomes crystalline; conversely, if the programmable element $P_{h,k}$ is brought over a higher melting temperature (such as 600° C.) and then cooled rapidly, the change-phase material becomes amorphous. The state of the programmable element $P_{h,k}$ is detected by applying a reading voltage (lower than the phase-change value Vpc, so as not to affect the phase of the material). The resulting current flowing through the programmable element $P_{h,k}$ is a signature of the resistivity of the material and then of its phase.

Each memory cell $P_{h,k}$–$T_{h,k}$ is connected between a word line $WL_h$ and a bit line $BL_k$. More specifically, the programmable elements $P_{h,k}$ of each column have a first terminal connected to the corresponding bit line $BL_k$. A second terminal of each programmable element $P_{h,k}$ is connected to the emitter terminal of the respective access transistor $T_{h,k}$. The access transistors $T_{h,k}$ of each row have the base terminal connected to the corresponding word line $WL_h$; the collector terminals of all the access transistors $T_{h,k}$ are connected to a ground terminal. In this way, each coupled word line/bit line ($WL_h$/$BL_k$) addresses a single memory cell $P_{h,k}$–$T_{h,k}$ of the matrix 105.

The memory device 100 simultaneously processes a word (for example, consisting of 16 bits). The bits of each word are stored in memory cells $P_{h,k}$–$T_{h,k}$ associated with a single word line $WL_h$; the bit lines $BL_k$ of the matrix 105 are grouped into 16 sub-sets, each one for a different word.

Each word is identified by an address ADR; in the following, the elements selected by the address ADR will be differentiated adding the sing "'" to the corresponding indexes. The address ADR consists of a portion ROW_ADR that is provided to a row decoder 110r and a portion COL_ADR that is provided to a column decoder 110c. The row decoder 110r selects the word line $WL_{h'}$ of the desired word. The column decoder 110c drives a multiplexer 115, which selects a bit line $BL_{k'}$ of the word in each sub-set. The multiplexer 115 interfaces with a read/write unit 120; the read/write unit 120 includes all the components (such as sense amplifiers, comparators, charge pumps, reference cells, pulse generators, and the like), which are used to write the selected programmable elements $P_{h',k'}$ or to read their values.

Each bit line $BL_k$ is further connected to a discharge transistor $D_k$ (consisting of an NMOS). In detail, the discharge transistor $D_k$ has the drain terminal connected to the corresponding bit line $BL_k$, and the source terminal connected to a terminal providing a reference voltage (for example, the ground terminal). The gate terminals of all the transistors $D_k$ are controlled by a discharge signal DIS.

In a stand-by condition, all the word lines $WL_h$ are kept at a high disabling voltage Vh (for example, 4.5V), while all the bit lines $BL_k$ are disconnected from the read/write unit 120. The discharge signal DIS is asserted at a power supply voltage Vdd of the memory device (for example, 1.8V); therefore, all the discharge transistors $D_k$ are on. In this way, the base-emitter junctions of all the access transistors $T_{h,k}$ are reverse biased (so as to disconnect the programmable elements $P_{h,k}$ from the corresponding word lines $WL_h$). However, a small leakage current lo flows through each access transistor $T_{h,k}$. The leakage currents lo of the access transistors $T_{h,k}$ associated with each bit line $BL_k$ are drained to the ground terminal by means of the corresponding discharge transistor $D_k$. This avoids charging a stray capacitor $C_k$ associated with the bit line $BL_k$ (shown in thin lines in the figure) to a dangerous voltage.

During a writing or reading operation, the discharge signal DIS is deasserted at the ground voltage (0V), so that all the discharge transistors $D_k$ turn off. The selected word line $WL_{h'}$ is then brought to a low enabling voltage Vl (for example, 0V). The selected bit lines $BL_{k'}$ are connected to the read/write unit 120 (while the other bit lines $BL_k$ are left floating); the read/write unit 120 drives the selected bit lines $BL_{k'}$ to a voltage corresponding to the requested operation.

The voltage applied to the selected bit lines $BL_{k'}$ is always comprised between a base-emitter threshold voltage Vbe of the access transistors $T_{h,k}$ (for example, 0.6V) and the voltage Vh-Vbe (4.5–0.6=3.9V). Therefore, only the base-emitter junctions of the access transistors $T_{h',k'}$ associated with the selected word line $WL_{h'}$ and the selected bit lines $BL_{k'}$ are forward biased (while the base-emitter junctions of the other access transistors $T_{h,k}$ remain reverse biased at a voltage at least equal to -Vbe).

Particularly, during a writing operation a high voltage pulse is applied to each selected bit line $BL_{k'}$; the voltage pulse has an amplitude and a duration depending on the desired state of the corresponding programmable element $P_{h',k'}$. On the other hand, during a reading operation a low voltage (for example, 1V) is applied to the selected bit lines $BL_{k'}$. The current flowing through each corresponding programmable element $P_{h',k'}$ is compared with a threshold value (typically provided by a reference cell); when the programmable element $P_{h',k'}$ is in the crystalline state a current higher than the threshold value is detected (corresponding to the logic value 1), whereas when the programmable element $P_{h',k'}$ is in the amorphous state a current lower than the threshold value is detected (corresponding to the logic value 0).

Figure 1B:
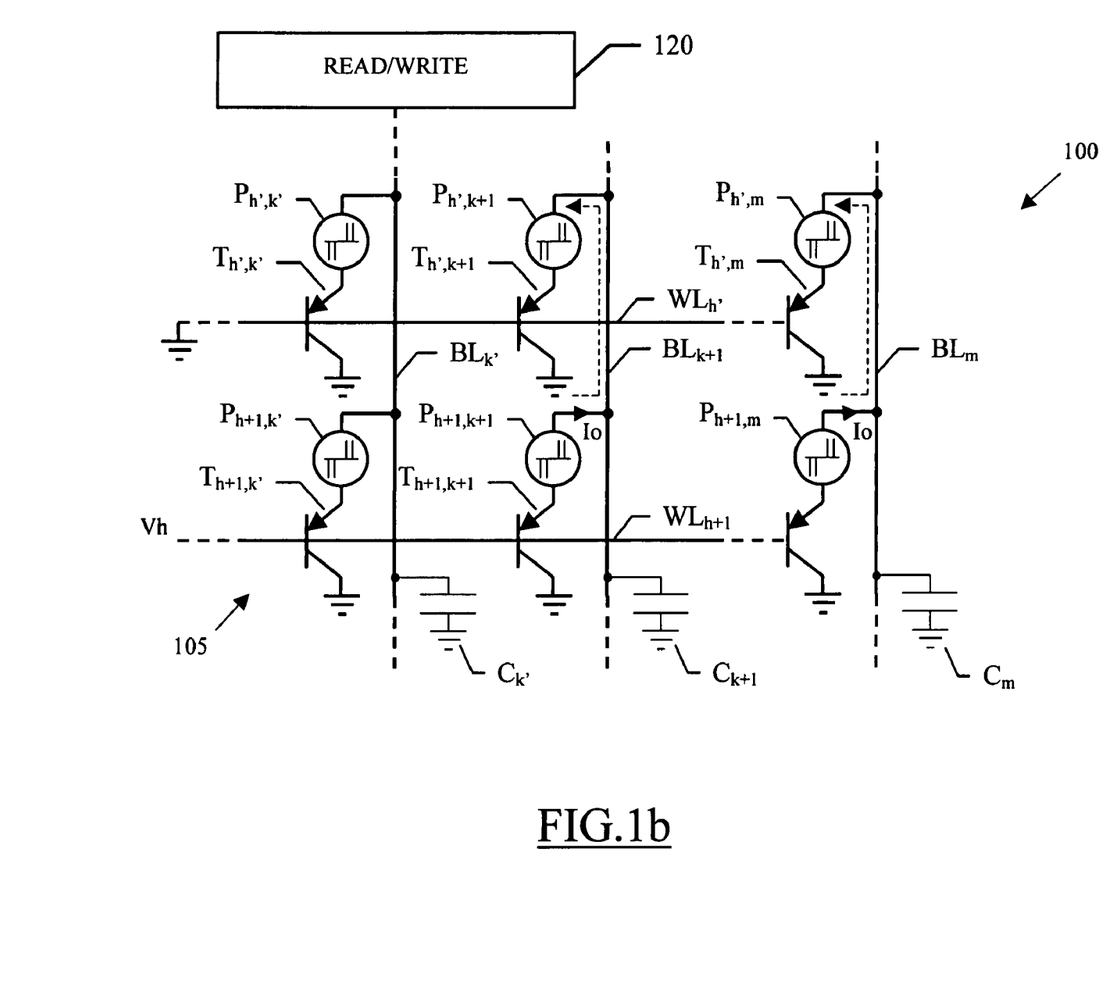
FIG. 1b is a functional representation of the memory device of FIG. 1a in operation.

In the above described condition, as shown in FIG. 1b, the leakage current lo of each access transistor $T_{h,k}$ in the deselected bit lines $BL_k$ charges the associated stray capacitor $C_k$. Therefore, the access transistor $T_{h',k}$ in the selected word line $WL_{h'}$ turns on, as soon as the voltage on the bit line $BL_k$ exceeds its base-emitter threshold voltage Vbe (0.6V). The current flowing through the associated programmable element $P_{h',k}$ raises the voltage on the selected word line $WL_{h'}$, with a corresponding disturb for the correct operation of the memory device 100. Moreover, if the voltage on the programmable element $P_{h',k}$ reaches the phase-change value Vpc (0.6V), a switch of the phase of the material can occur. The phase switch can cause a spurious set of the state of the programmable element $P_{h',k}$ (from the amorphous phase to the crystalline phase), with an undesired change of the stored value. In any case, even when the phase switch is only transient, a wrong value can be read if the programmable element $P_{h',k}$ is selected before a corresponding recovery time.

For example, a critical condition occurs when the voltage on a generic deselected bit line $BL_k$ reaches 0.6+0.6=1.2V. In the worst condition (wherein the programmable element $P_{h',k}$ associated with the selected word line $WL_{h'}$ is in the amorphous state, for example, with a resistance of 1 MΩ), the current that flows through the programmable element $P_{h',k}$ is $$\frac{0.6}{1 \cdot 10^6} = 600 \, nA.$$

The corresponding leakage current lo that is required by each access transistor $T_{h,k}$ of the deselected bit line $BL_k$ is then $$\frac{600 \cdot 10^{-6}}{2024} = 292 \, pA.$$

Experimental results have shown that a leakage current lo higher than the above-mentioned value can be reached (at room temperature) when a reverse voltage of 4.5−1.2=3.3V is applied to the access transistors $T_{h,k}$.

Similar considerations apply if the memory device has a different structure, if the memory cells are multilevel, or if the operative parameters of the memory device have other values. Alternatively, similar considerations apply if the memory cells are arranged in two or more matrixes, if a different number of bit lines is selected simultaneously (down to a single one), or if the BJT transistors are replaced with equivalent unidirectional conduction access elements (such as diodes or MOS transistors).

Figure 2:
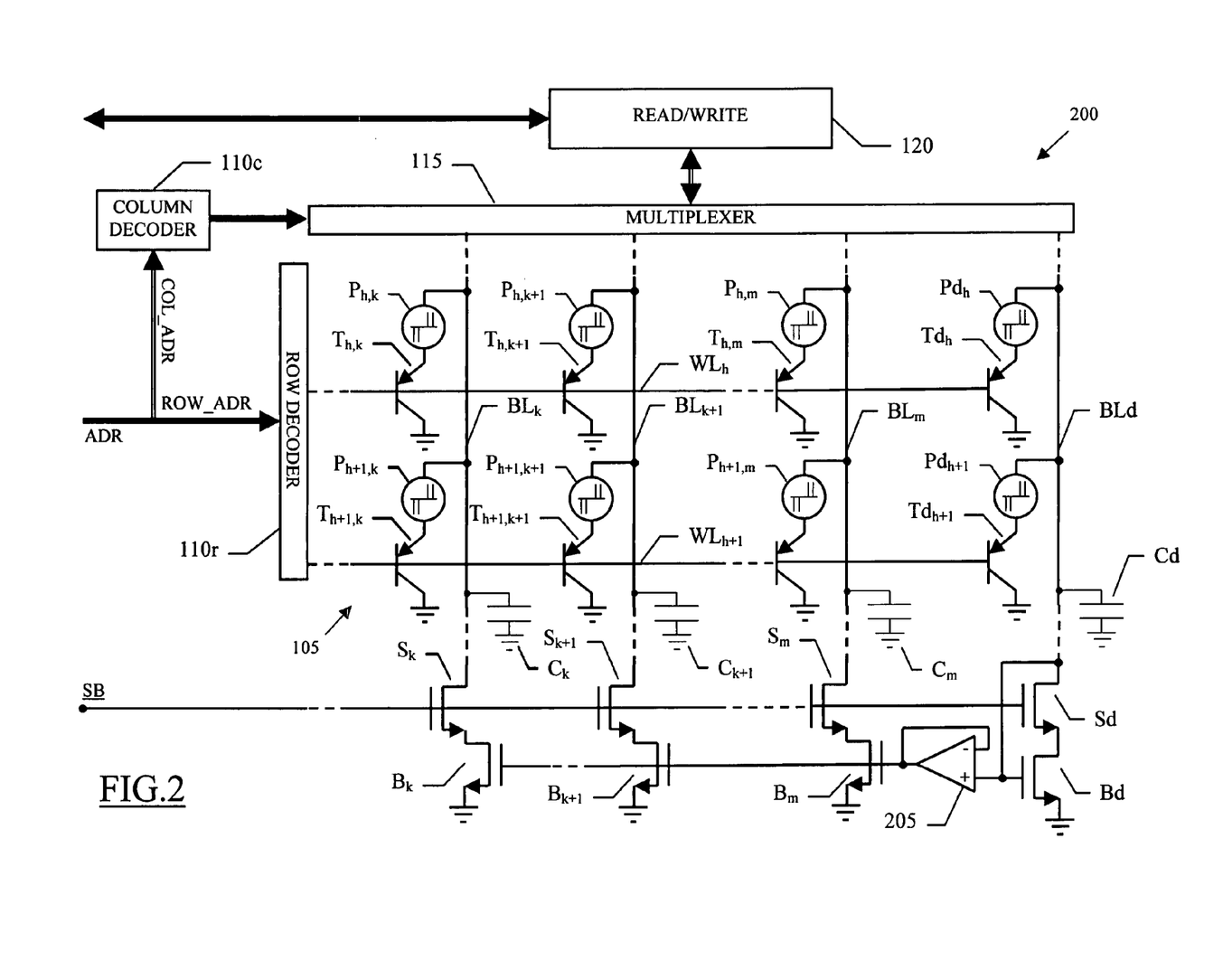
FIGS. 2, 3a and 3b illustrate different memory devices according to respective embodiments of the present invention.

Considering now FIG. 2, a memory device 200 according to a first embodiment of the invention is illustrated (the elements corresponding to the ones in the FIG. 1a are denoted with the same references, and their explanation is omitted for the sake of simplicity).

The memory device 200 includes one or more auxiliary (or dummy) columns of memory cells $Pd_h$–$Td_h$ (only one shown in the figure); preferably, a dummy column of memory cells $Pd_h$–$Td_h$ is provided for each sub-set of bit lines $BL_k$ (so as to reduce any mismatching). Each memory cell $Pd_h$–$Td_h$ consists of the series of a programmable element $Pd_h$ and an access transistor $Td_h$. The memory cells $Pd_h$–$Td_h$ of the dummy column are associated with a dummy bit line BLd, which is coupled with the multiplexer 115. The dummy bit line BLd has a capacitance represented by a stray capacitor Cd (shown in thin lines in the figure).

Each memory cell $Pd_h$–$Td_h$ is connected between a word line $WL_h$ and the dummy bit line BLd. More specifically, all the programmable elements $Pd_h$ have a first terminal connected to the dummy bit line BLd. A second terminal of each programmable element $Pd_h$ is connected to the emitter terminal of the respective access transistor $Td_h$. Each access transistor $Td_h$ has the base terminal connected to the corresponding word line $WL_h$; the collector terminals of all the access transistors $Td_h$ are connected to the ground terminal.

Each (functional) bit line $BL_k$ is connected to the drain terminal of a stand-by transistor $S_k$ (consisting of an NMOS); likewise, the dummy bit line BLd is connected to the drain terminal of a stand-by transistor Sd. The gate terminals of all the transistors $B_k$,Bd are controlled by a stand-by signal SB; the stand-by signal SB is underlined to indicate that it is asserted at low voltage (0V) and asserted at high voltage (Vdd).

The source terminal of each stand-by transistor $S_k$ is connected to the drain terminal of a biasing transistor $B_k$ (consisting of an NMOS), and the source terminal of the stand-by transistor Sd is connected to the drain terminal of a biasing transistor Bd. Preferably, the biasing transistors $B_k$,Bd have a natural structure (without any specific doping of their channel regions); therefore, the biasing transistors $B_k$,Bd exhibit a very low gate-source threshold voltage (such as 0.3V). The source terminals of all the biasing transistors $B_k$,Bd are connected to the ground terminal.

The gate terminal of the biasing transistor Bd is short-circuited to the drain terminal of the stand-by transistor Sd. The gate terminal of the biasing transistor Bd is also connected to the gate terminals of all the biasing transistors $B_k$ through a buffer 205. In detail, the buffer 205 consists of an operational amplifier in the follower configuration (with the inverting input terminal short-circuited to its output terminal). The gate terminal of the biasing transistor Bd is connected to the non-inverting input terminal of the buffer 205. The output terminal of the buffer 205 directly drives the gate terminals of all the biasing transistors $B_k$.

In this way, the structure $B_k$,Bd, 205 implements a (buffered) current mirror. The current mirror $B_k$,Bd, 205 has an input leg (biasing transistor Bd), which is connected to the dummy bit line BLd; moreover, the current mirror $B_k$,Bd, 205 has m=2048 output legs (biasing transistors $B_k$), each one for a corresponding bit line $BL_k$. The buffer 205 decouples the input leg from the output legs, providing the current capability required to drive the high capacitive load of the gate terminals of all the biasing transistors $B_k$.

In a (deep) stand-by condition, the corresponding signal SB is asserted (0V). Therefore, all the stand-by transistors $S_k$,Sd are off (so as to reduce the power consumption of the memory device 200).

The stand-by signal SB is deasserted (Vdd) when the memory device 200 is in use; in response thereto, the transistors $S_k$,Sd turn on. In this condition, the voltage on every bit line $BL_k$,BLd (disregarding the small overdrive of the biasing transistors $B_k$,Bd) is kept at the gate-source threshold voltage of the biasing transistor Bd (0.3V).

During a writing or reading operation, the voltage on the selected bit lines $BL_{k'}$ is driven to the desired value by the read/write unit 120; it should be noted that the above described structure does not interfere with operation of the memory device 200 (being the driving capability of the read/write unit 120 far higher than the one of the biasing transistors $B_{k'}$). Moreover, the selected bit lines $BL_{k'}$ are already at a positive voltage (0.3V) at the beginning of the operation. Therefore, the speed of the operation is increased (since it is not necessary to charge the selected bit lines $BL_{k'}$ to the desired voltage from ground); at the same time, the power consumption of the memory device 200 is reduced accordingly.

The other bit lines $BL_k$,BLd are always maintained at the gate-source threshold voltage of the biasing transistor Bd. The low threshold voltage of the biasing transistors $B_k$,Bd provides a good safety margin (since the voltage on the deselected bit lines $BL_k$ is far away from its dangerous value); at the same time, the stand-by transistors $S_k$,Sd ensure a complete cut off of the current flowing through the bit lines $BL_k$,BLd in the deep stand-by condition (which complete cut off cannot be guaranteed by the intrinsic characteristics of the biasing transistors $B_k$,Bd).

In the above-described condition, the current mirror $B_k$,Bd, 205 drains the current provided by the dummy bit line BLd towards the ground terminal in each functional bit line $BL_k$. The drained current is substantially the same as the total leakage currents lo in each deselected bit line $BL_k$ (being the voltage applied to the respective access transistors $T_{h,k}$ exactly the same); that current is also very similar to the total leakage current lo in the selected bit line $BL_{k'}$, since the difference due to the (forward biased) access transistor $T_{h',k'}$ in the selected word line $WL_{h'}$ is negligible.

In this way, the precision of the reading operation is strongly improved. Indeed, any noise in the value of the current that is detected by the read/write unit 120 (owing to the leakage currents lo flowing through the selected bit line $BL_{k'}$) is substantially reduced. Moreover, the current that is driven in the selected bit line $BL_{k'}$ by the read/write unit 120 may be higher (without the risk of switching the phase of the material, because of an increase of the current flowing through the programmable element $P_{h',k'}$ due to the leakage currents lo).

Similar considerations apply if the dummy bit line is not connected to the multiplexer or if the buffer has a different structure. However, the concepts of the present inventions are also applicable when the gate terminal of each biasing transistor is short-circuited to its drain terminal, when the positions of the stand-by transistors and the biasing transistors are reversed, or when the stand-by transistors are replaced with equivalent electronic switches. Alternatively, the current mirror can be implemented without any buffer, the biasing transistors can be non-natural (for example, they consist of standard transistors modeled with a lower threshold voltage), or a single dummy bit line can be used for the whole matrix.

Figure 3A:
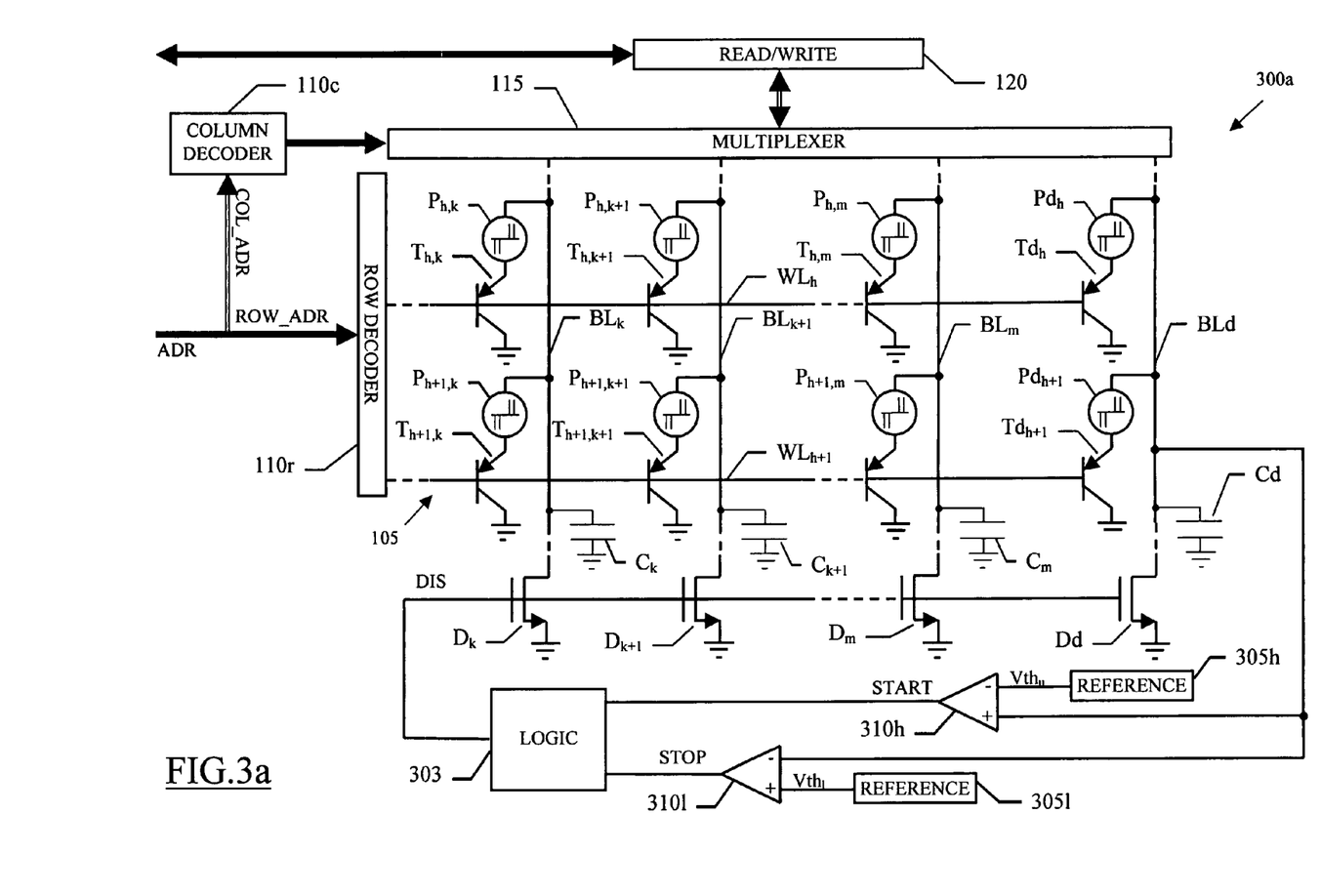

A different embodiment of the invention is illustrated in FIG. 3a (the elements corresponding to the ones in the FIGS. 1a and 2 are denoted with the same references, and their explanation is omitted for the sake of simplicity). The figure shows a memory device 300a, wherein the matrix 105 includes the (functional) bit lines $BL_k$ with the respective discharge transistors $D_k$. The memory device 300a further includes a dummy column of memory cells $Pd_h$–$Td_h$ for each sub-set of bit lines $BL_k$. The dummy bit line BLd is connected to an additional discharge transistor Dd. In detail, the discharge transistor Dd has the drain terminal connected to the dummy bit line BLd and the source terminal connected to the ground terminal; the gate terminal of the transistor Dd is controlled by the discharge signal DIS. The discharge signal DIS for all the transistors $D_k$,Dd is generated by an internal logic circuit 303 (as described in detail in the following).

A reference block 305h (for example, consisting of a band-gap circuit) generates an upper threshold voltage $Vth_u$ (such as 0.5V). The upper threshold voltage $Vth_u$ is supplied to the inverting input terminal of a comparator 310h; the non-inverting input terminal of the comparator 310h is directly connected to the dummy bit line BLd. The output terminal of the comparator 310h supplies a signal START to the logic block 303; the signal START is asserted when the voltage on the dummy bit line BLd exceeds the upper threshold voltage $Vth_u$. Likewise, a further reference block 305l generates a lower threshold voltage $Vth_l$ (such as 0.3V). The lower threshold voltage $Vth_l$ is supplied to the non-inverting input terminal of a comparator 310l; the inverting input terminal of the comparator 310l is directly connected to the dummy bit line BLd. The output terminal of the comparator 310l supplies a signal STOP to the logic block 303; the signal STOP is asserted when the voltage on the dummy bit line BLd falls below the lower threshold voltage $Vth_l$.

The logic block 303 asserts and deasserts the discharge signal DIS in response to the signal START and to the signal STOP, respectively. For example, the logic block 303 consists of a latch that is set by the signal START and is reset by the signal STOP.

Assuming that the discharge signal DIS is deasserted, the leakage currents lo flowing through the access transistors $Td_h$ of the dummy bit line BLd charge the corresponding stray capacitor Cd. The same considerations apply to all the functional bit lines $BL_k$ in the stand-by condition or to the deselected bit lines BLk when a reading/writing operation is in progress (while the selected bit line $BL_{k'}$ is driven to the desired voltage by the read/write unit 120).

The voltage on the dummy bit line BLd is substantially the same as the voltage on each deselected bit line $BL_k$; in this way, it is possible to obtain a measure of the voltage on the deselected bit lines $BL_k$ without updating the structure of the matrix 105; moreover, this solution avoids interfering with operation of the memory device 300a (for example, because of the capacitive loads of the comparators 310h and 310l).

As soon as the voltage on the dummy bit line BLd reaches the upper threshold voltage $Vth_u$, the signal START is asserted. In response thereto, the discharge signal DIS is asserted as well, so that all the discharge transistors $D_k$,Dd turn on. In this way, the voltage on the deselected bit lines $BL_k$ and on the dummy bit line BLd are pulled down (with the leakage currents lo that are drained towards the ground terminal through the respective discharge transistors $D_k$,Dd); the signal START is then deasserted after a short delay. It should be noted that the above-described structure does not interfere with operation of the memory device 300a (being the driving capability of the read/write unit 120 is far higher than the discharge transistors $D_k$).

When the voltage on the dummy bit line BLd falls below the lower threshold voltage $Vth_l$, the signal STOP is asserted. In response thereto, the discharge signal DIS is deasserted, so that all the discharge transistors $D_k$,Dd turn off. The stray capacitor Cd of the dummy bit line BLd and the stray capacitors $C_k$ of the deselected bit lines $BL_k$ start charging again (with the signal STOP that is deasserted after a short delay).

The same operations described above are continually repeated. In this way, the voltage on each deselected bit line $BL_k$ (and on the dummy bit line BLd at the same time) is maintained in a range defined by the lower threshold voltage $Vth_l$ and the upper threshold voltage $Vth_u$.

The proposed solution prevents the voltage on the deselected bit lines BLk from reaching a dangerous value. At the same time, the bit lines $BL_k$ are maintained at a voltage that improves the speed of any operation on the memory device 300a and reduces its power consumption.

Similar considerations apply if the upper threshold voltage and/or the lower threshold voltage have different values, or if an equivalent circuit is used for generating the discharge signal.

An alternative implementation of the structure described above is illustrated in FIG. 3b (the elements corresponding to the ones in the FIG. 3a are denoted with the same references, and their explanation is omitted for the sake of simplicity). The figure shows a memory device 300b, wherein the discharge signal DIS is obtained from the signal START only (without the blocks for generating the signal STOP).

Figure 3B:
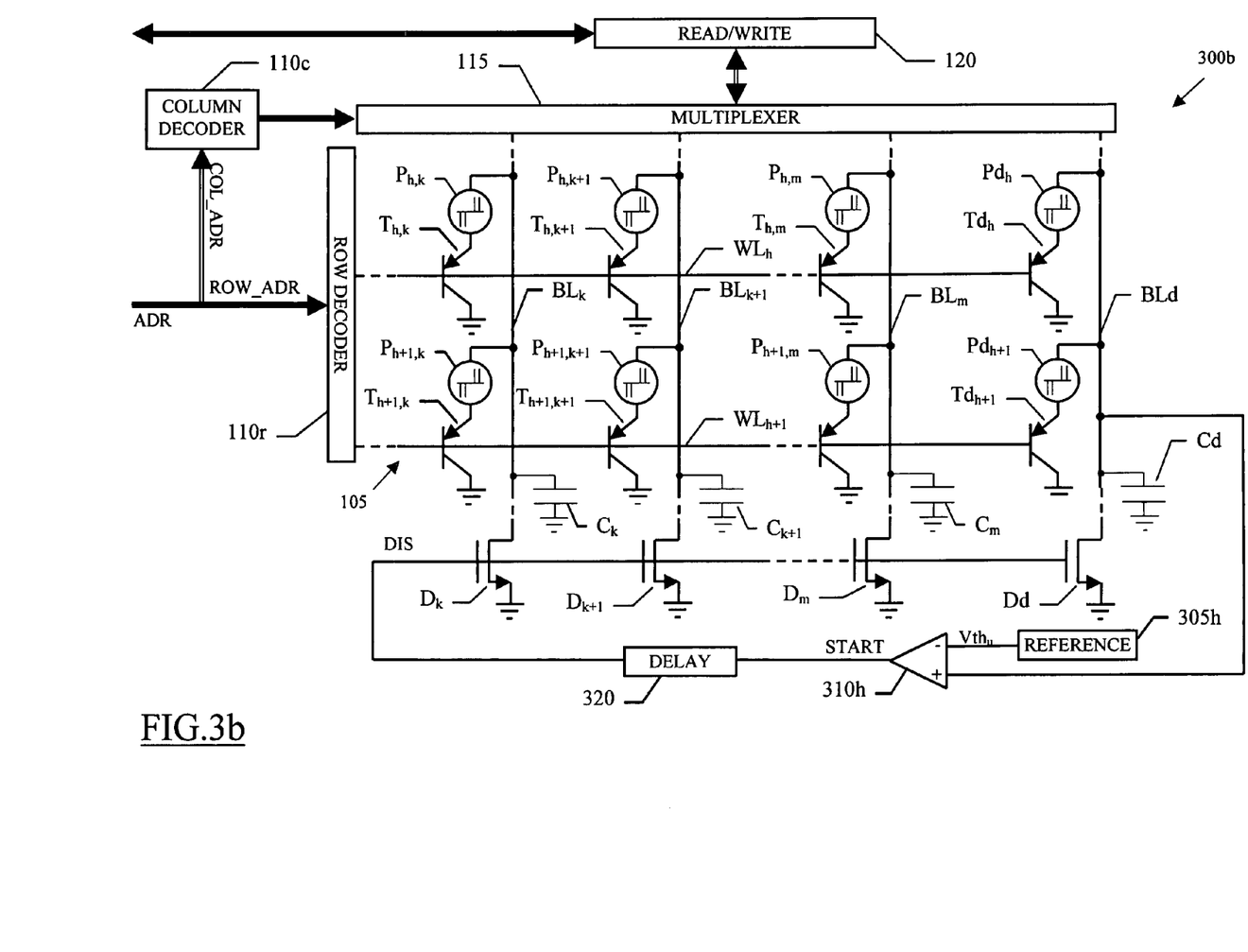

Particularly, the signal START is provided to a delay line 320. The delay line 320 asserts the discharge signal DIS in response to the assertion of the signal START; the discharge signal DIS is maintained asserted for a pre-set period (for example, some ms).

Assuming that the discharge signal DIS is deasserted, the leakage currents lo flowing through the access transistors $Td_h, T_{h,k}$ of the dummy bit line BLd and the deselected bit lines $BL_k$ charge the respective stray capacitors $Cd, C_k$. As soon as the voltage on the dummy bit line BLd reaches the upper threshold voltage $Vth_u$, the signal START is asserted. In response thereto, the discharge signal DIS is asserted as well, so that all the discharge transistors $D_k$,Dd turn on. In this way, the stray capacitors $C_k$ associated with the deselected bit lines $BL_k$ and the stray capacitor Cd associated with the dummy bit line BLd are discharged towards the ground terminal; the signal START is then deasserted after a short delay. The voltage on the deselected bit lines $BL_k$ and on the dummy bit line BLd are reduced of a value corresponding to the duration of the discharge signal DIS (for example, a few hundreds of mV). When the discharge signal DIS is deasserted, all the discharge transistors $D_k$,Dd turn off. The stray capacitors $C_k$,Cd of the deselected bit lines $BL_k$ and of the dummy bit line BLd then start charging again.

The same operations described above are continually repeated. In this way, the voltage on each deselected bit line $BL_k$ (and on the dummy bit line BLd at the same time) is maintained in a predefined range having its upper limit defined by the voltage $Vth_u$.

Similar considerations apply if the discharge signal has a different duration, or if the discharge signal is generated with an equivalent circuit.

More generally, an embodiment of the present invention proposes a memory device. The memory device includes a matrix of memory cells, which are arranged in a plurality of rows and a plurality of columns; each memory cell includes a functional element with a programmable resistivity and a unidirectional conduction access element connected in series. The memory device further includes a plurality of word lines and a plurality of bit lines; the memory cells of each row are connected to a corresponding word line and the memory cells of each column are connected to a corresponding bit line. Means are provided for driving the bit lines to a desired voltage. Means are used for selecting one or more bit lines in an operative condition of the memory device; each selected bit line is connected to the means for driving and each deselected bit line is disconnected from the means for driving. Further means are used for selecting a word line in the operative condition; each access element associated with the selected word line and the selected bit lines is forward biased and the other access elements are reverse biased. The memory device according to this embodiment of the invention further includes means for biasing the deselected bit lines in the operative condition, in order to prevent a leakage current of the reverse biased access elements from forward biasing the access elements associated with the selected word line and the deselected bit lines.

In embodiments of the invention, the biasing of the deselected bit lines in the operative condition ensures that the leakage currents do not charge the corresponding stray capacitors over a dangerous voltage.

Particularly, the devised structures avoid turning on the access elements (in the deselected bit lines) that are associated with the selected word line. As a consequence, any wrong reading of the memory cells or any undesired change in their state is prevented.

The embodiments of the invention are particularly advantageous when the memory device works at high temperature or when the matrix of memory cells includes a high number of rows (even if different applications are not excluded).

Preferred embodiments of the invention described above offer further advantages.

Particularly, a biasing current (corresponding to the total leakage current in each deselected bit line) is continuously drained from all the bit lines.

This solution reduces the voltage that can be reached by the bit lines; at the same time, the current drained from the selected bit line improves the precision of the reading operations.

A suggested choice for implementing the above-described structure is that of using a dummy column of memory cells (providing a current that is mirrored to every functional bit line).

As a consequence, the current that is drained from each bit line is substantially the same as the corresponding total leakage current.

Advantageously, the biasing transistors have a low threshold voltage, and additional electronic switches are used to disconnect the bit lines from the current mirror in the stand-by condition.

In this way, a good safety margin is provided; at the same time, the power consumption of the memory device can be strongly reduced when necessary.

However, embodiments of the present invention may be implemented by draining the biasing current from the deselected bit lines in a different way, or with another structure for generating the current to be drained; alternatively, the threshold voltage of the biasing transistors is the same as the one of the access transistors, or the memory device does not include any stand-by transistor. For example, the stand-by condition can be entered by applying a negative voltage (such as −0.1V) to the biasing transistors; in this way, a complete cut off of the current flowing through the bit lines is achieved without any additional stand-by transistors.

In a different embodiment of the invention, the bit lines are discharged when their voltage reaches a threshold value.

As a consequence, the voltage on the deselected bit lines is prevented from rising over a dangerous value; at the same time, the voltage maintained on the bit lines improves the speed of any operation on the memory device and reduces its power consumption. In addition, the proposed solution does not require any stand-by circuit.

As a further enhancement, the voltage on the deselected bit lines is estimated using a dummy column of memory cells.

The devised structure avoids updating the matrix of memory cells, and does not introduce any additional capacitive load on the functional bit lines.

In a proposed implementation, the discharging of the bit lines is stopped when their voltage falls below a further threshold value.

As a consequence, the voltage on the deselected bit lines can be maintained in a predefined range with a high degree of precision.

A different implementation involves the discharging of the bit lines for a predefined period.

The loss of precision introduced by this solution is insignificant in practice, and it is more than compensated for by the simplicity of the circuit.

Alternatively, the voltage on the bit lines is measured directly (without any dummy column of memory cells), or the discharging of the bit lines is enabled in a different way. For example, the bit lines can be discharged periodically (even if a discharge frequency working correctly at the highest temperature that is allowable for the memory device involves an increase in the power consumption at room temperature).

In any case, embodiments of the invention are also suitable to be implemented with different structures for biasing the bit lines (or at least the deselected ones) in the operative condition of the memory device.

Without detracting from its general applicability, the described embodiments of the invention are specifically designed for a phase-change memory device (even if different applications are not excluded).

Embodiments of the invention maybe utilized in a variety of different types of integrated circuits, such as the described phase-change memories. Moreover, these phase-change memories or other integrated circuits may be utilized in a variety of different types of electronic systems, such computer systems.

Naturally, in order to satisfy local and specific requirements, a person skilled in the art may apply to the solution described above many modifications and alterations all of which, however, are included within the scope of protection of the invention as defined by the following claims.

The invention claimed is:

1. A memory device including a matrix of memory cells arranged in a plurality of rows and a plurality of columns, each memory cell including a functional element with a programmable resistivity and a unidirectional conduction access element connected in series, a plurality of word lines and a plurality of bit lines, the memory cells of each row being connected to a corresponding word line and the memory cells of each column being connected to a corresponding bit line, means for driving the bit lines to a desired voltage, means for selecting at least one bit line in an operative condition of the memory device, each selected bit line being connected to the means for driving and each deselected bit line being disconnected from the means for driving, and means for selecting a word line in the operative condition, each access element associated with the selected word line and the at least one selected bit tine being forward biased and the other access elements being reverse biased, wherein the memory device further includes means for biasing the deselected bit lines in the operative condition to prevent a leakage current of the reverse biased access elements from forward biasing the access elements associated with the selected line and the deselected bit lines; and, wherein the bit lines are grouped into at least one sub-set and the means for biasing includes a biasing structure for each sub-set, the biasing structure including means for providing a biasing current corresponding to a total leakage current of each corresponding bit line, and means for draining the biasing current from each corresponding bit line.

2. The memory device according to claim 1, wherein the means for providing the biasing current includes an auxiliary column of memory cells, the memory cells of the auxiliary column being associated with an auxiliary bit line disconnected from the means for driving in the operative condition, and wherein the means for draining includes a current mirror having a first leg connected to the auxiliary bit line and a plurality of second legs each one connected to a corresponding bit line.

3. The memory device according to claim 2, wherein each leg of the current mirror includes a biasing transistor having a threshold voltage lower than a threshold voltage of each corresponding access element, and wherein each biasing structure further includes an electronic switch for each leg of the current mirror, the electronic switch selectively connecting the leg to the corresponding bit line in the operative condition and disconnecting the leg from the corresponding bit line in a stand-by condition of the memory device.

4. The memory device according to claim 1, wherein the bit lines are grouped into at least one sub-set and the means for biasing includes a biasing structure for each sub-set, the biasing structure including means for discharging the corresponding bit lines and means for enabling the means for discharging when an indication of a voltage on the corresponding deselected bit lines reaches a threshold value.

5. The memory device according to claim 4, wherein each biasing structure further includes an auxiliary column of memory cells, the memory cells of the auxiliary column being associated with an auxiliary bit line disconnected from the means for driving in the operative condition, and wherein the indication of the voltage on the corresponding deselected bit lines consists of a voltage on the auxiliary bit line.

6. The memory device according to claim 4, wherein each biasing structure further includes means for disabling the means for discharging when the indication of the voltage on the corresponding deselected bit lines exits a range defined by the threshold value and a further threshold value.

7. The memory device according to claim 4, wherein each biasing structure further includes means for disabling the means for discharging after a predetermined delay from an enabling thereof.

8. The memory device according to claim 1, wherein each functional element is of the phase-change type.

9. A biasing circuit including a plurality of bit line nodes, each bit line node being adapted to be coupled to a corresponding bit line in a memory-cell array containing a plurality of memory cells, the biasing circuit operable in a bias mode to drive the bit line nodes associated with non-selected bit lines to a bias voltage while data is being transferred to or from memory cells coupled to selected bit lines in the array, wherein the memory-cell array includes a plurality of memory cells arranged in rows and columns and wherein each of the memory cells in the array includes an access element, the biasing circuit being operable to drive bit line nodes associated with non-selected bit lines to the bias voltage having a value sufficient to substantially prevent a leakage current through access elements in memory cells contained in non-selected rows of memory cells in the array.

10. The biasing circuit of claim 9 wherein the value of the bias voltage is less than a forward bias value associated with access elements contained in memory cells contained in a selected row of the array.

11. The biasing circuit of claim 10 wherein the current mirror comprises:
a dummy bias element coupled to a dummy bit line node that is adapted to be coupled to a dummy bit line in the memory-cell array, the dummy bias element operable to sink a set current from the dummy bit line node; and
a plurality of bias elements, each bias element being coupled to a respective bit line node and each bias element operable responsive to the set current through the dummy bias element to sink approximately the set current from the corresponding bit line node.

12. The biasing circuit of claim 11,
wherein the dummy bias element comprises a diode-coupled transistor;
wherein each of the bias elements comprises a transistor adapted to be coupled to the corresponding bit line node; and
wherein the current mirror further comprises an operational amplifier configured as a voltage follower with an output coupled to control node of bias element transistors, an inverting input coupled to the output, and a non-inverting input coupled a control node of the dummy bias element transistor.

13. The biasing circuit of claim 12 further comprising a plurality of standby transistors, each standby transistor being coupled in series with a corresponding one of the dummy bias element and the bias elements and being adapted to receive an activation signal on a control node.

14. The biasing circuit of claim 9 wherein the biasing circuit is further operable to sink a current from each of the non-selected bit lines to drive the voltage on each of the non-selected nodes to the bias voltage.

15. The biasing circuit of claim 9 wherein the biasing circuit comprises a current mirror that sinks the current from the bit lines.

16. The biasing circuit of claim 9 wherein the biasing circuit is further operable to detect a high threshold voltage and a low threshold voltage on each of the bit line nodes associated with non-selected bit lines, and wherein the biasing circuit is operable to maintain the voltage on each of these bit line nodes between the high and low threshold voltages so that the bias voltage corresponds to this range of voltages between the high and low threshold voltages.

17. The biasing circuit of claim 16 wherein the biasing circuit further comprises:
a high threshold comparator adapted to receive a high threshold value on one input and having a second input adapted to be coupled to a dummy bit line in the memory-cell array via a dummy bit line node, the high threshold comparator operable to activate a start signal on an output responsive to a voltage on the dummy bit line node being greater than the high threshold value;
a low threshold comparator adapted to receive a low threshold value on one input and having a second input adapted to be coupled to the dummy bit line node, the low threshold comparator operable to activate a stop signal on an output responsive to a voltage on the dummy bit line node being less than the low threshold value;
logic circuitry coupled to the outputs of the comparators, the logic circuitry operable to activate a discharge signal responsive to the start signal going active and operable to deactivate the discharge signal responsive to the stop signal going active; and
a plurality of discharge elements, each discharge element being coupled between a respective bit line node and reference voltage source and being operable responsive the discharge signal being active to couple the corresponding bit line node to the reference voltage source, and each discharge element being operable responsive to the discharge signal being inactive to isolate the corresponding bit line node from the reference voltage source.

18. The biasing circuit of claim 9 wherein the biasing circuit is further operable to detect a threshold voltage on each of the bit line nodes associated with non-selected bit lines, and wherein the biasing circuit is operable to maintain the voltage on each of these bit line nodes less than the threshold voltage.

19. The biasing circuit of claim 18 wherein the biasing circuit includes a dummy bit line node adapted to be coupled to a dummy bit line in the memory-cell array, and wherein the biasing circuit detects the voltage on the dummy bit line node to detect the threshold voltage.

20. The biasing circuit of claim 19 wherein the biasing circuit is further operable to sink current from each of the non-selected bit lines via the corresponding bit line nodes for a predetermined time responsive to the detected voltage on the dummy bit line node being equal to or greater than the threshold voltage.

21. The biasing circuit of claim 9 wherein the biasing circuit is further operable to periodically sink current from each of the non-selected bit lines via the corresponding nodes to maintain the voltage on each of these bit line nodes less than a threshold value.

22. A memory device, comprising:
a memory-cell array including a plurality of memory cells arranged in rows and columns, each memory cell in a respective column being coupled to a corresponding bit line and each memory cell in a respective row being coupled to a corresponding word line;
read/write circuitry coupled to the bit lines;
address decode circuitry coupled to the word lines and the read/write circuitry; and
a biasing circuit including a plurality of bit line nodes, each bit line node being coupled to a corresponding bit line in the memory-cell array, the biasing circuit operable in a bias mode to drive the bit line nodes associated with non-selected bit lines to a bias voltage while data is being transferred to or from memory cells coupled to selected bit lines, wherein each memory cell comprises a phase-change memory cell including a phase-change element and an access element coupled in series between a corresponding bit line and a reference voltage source, each access element including a control node coupled to a corresponding word line.

23. An electronic system, comprising:
a memory device including,
a memory-cell array including a plurality of memory cells arranged in rows and columns, each memory cell in a respective column being coupled to a corresponding bit line and each memory cell in a respective row being coupled to a corresponding word line;
read/write circuitry coupled to the bit lines;
address decode circuitry coupled to the word lines and the read/write circuitry; and
a biasing circuit including a plurality of bit line nodes, each bit line node being coupled to a corresponding bit line in the memory-cell array, the biasing circuit operable in a bias mode to drive the bit line nodes associated with non-selected bit lines to a bias voltage while data is being transferred to or from memory cells coupled to selected bit lines, wherein each memory cell comprises a phase-change memory cell including a phase-change element and an access element coupled in series between a corresponding bit line and a reference voltage source, each access element including a control node coupled to a corresponding word line.

24. The electronic system of claim 23 wherein the electronic system comprises a computer system.

25. A method of reading data from and writing data to memory cells in a memory-cell array including a plurality of memory cells arranged in rows and columns, each memory cell in a respective column being coupled to a corresponding bit line and each memory cell in a respective row being coupled to a corresponding word line, the method comprising:

activating a word line to activate memory cells in corresponding row in the array;

driving selected bit lines associated with addressed memory cells to selected voltage levels to write data to or read data from the addressed memory cells; and biasing the bit lines associated with non-addressed memory cells at a bias voltage while data is being written to or read from the addressed memory cells, this biasing including generating a reference current; and in response to the reference current, sinking approximately the reference current from the bit lines associated with the non-addressed memory cells to bias these bit lines at the bias voltage.

26. A method of reading data from and writing data to memory cells in a memory-cell array including a plurality of memory cells arranged in rows and columns, each memory cell in a respective column being coupled to a corresponding bit line and each memory cell in a respective row being coupled to a corresponding word line, the method comprising:

activating a word line to activate memory cells in corresponding row in the array;

driving selected bit lines associated with addressed memory cells to selected voltage levels to write data to or read data from the addressed memory cells; and biasing the bit lines associated with non-addressed memory cells at a bias voltage while data is being written to or read from the addressed memory cells, this biasing including periodically discharging current from the bit lines associated with the non-addressed memory cells to bias these bit lines at the bias voltage.

27. A method of reading data from and writing data to memory cells in a memory-cell array including a plurality of memory cells arranged in rows and columns, each memory cell in a respective column being coupled to a corresponding bit line and each memory cell in a respective row being coupled to a corresponding word line, the method comprising:

activating a word line to activate memory cells in corresponding row in the array;

driving selected bit lines associated with addressed memory cells to selected voltage levels to write data to or read data from the addressed memory cells; and biasing the bit lines associated with non-addressed memory cells at a bias voltage while data is being written to or read from the addressed memory cells, this biasing including detecting a voltage on a dummy bit line in the memory-cell array;

responsive to the voltage on the dummy bit line exceeding an upper threshold value, discharging current from the bit lines associated with the non-addressed memory cells;

responsive to the voltage on the dummy bit line being less than a lower threshold value, terminating the discharging of current from the bit lines associated with the non-addressed memory cells.

28. A method of reading data from and writing data to memory cells in a memory-cell array including a plurality of memory cells arranged in rows and columns, each memory cell in a respective column being coupled to a corresponding bit line and each memory cell in a respective row being coupled to a corresponding word line, the method comprising:

activating a word line to activate memory cells in corresponding row in the array;

driving selected bit lines associated with addressed memory cells to selected voltage levels to write data to or read data from the addressed memory cells; and biasing the bit lines associated with non-addressed memory cells at a bias voltage while data is being written to or read from the addressed memory cells, this biasing including detecting a voltage on a dummy bit line in the memory-cell array;

responsive to the voltage on the dummy bit line exceeding an upper threshold value, discharging current from the bit lines associated with the non-addressed memory cells for a delay time.

* * * * *

UNITED STATES PATENT AND TRADEMARK OFFICE
CERTIFICATE OF CORRECTION

| | | |
|---|---|---|
| PATENT NO. | : 7,092,277 B2 | Page 1 of 1 |
| APPLICATION NO. | : 10/926784 | |
| DATED | : August 15, 2006 | |
| INVENTOR(S) | : Bedeschi et al. | |

It is certified that error appears in the above-identified patent and that said Letters Patent is hereby corrected as shown below:

Column 11 Line 58 change "tine" to --line--
Column 11 Line 64 insert --word-- between "selected" and "line" to read --selected word line--

Signed and Sealed this

Twenty-second Day of May, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,092,277 B2 | Page 1 of 1 |
| APPLICATION NO. | : 10/926784 | |
| DATED | : August 15, 2006 | |
| INVENTOR(S) | : Bedeschi et al. | |

It is certified that error appears in the above-identified patent and that said Letters Patent is hereby corrected as shown below:

Column 11 Line 58 change "tine" to --line--
Column 11 Line 64 insert --word-- between "selected" and "line" to read --selected word line--

Signed and Sealed this

Fifth Day of June, 2007

JON W. DUDAS
*Director of the United States Patent and Trademark Office*